United States Patent [19]

Jerabek

[11] Patent Number: 4,526,840
[45] Date of Patent: Jul. 2, 1985

[54] BAR EVAPORATION SOURCE HAVING IMPROVED WETTABILITY

[75] Inventor: Charles F. Jerabek, Rye, N.H.

[73] Assignee: GTE Products Corporation, Stamford, Conn.

[21] Appl. No.: 465,706

[22] Filed: Feb. 11, 1983

[51] Int. Cl.³ .............................................. B32B 3/00
[52] U.S. Cl. .................................. 428/596; 428/600; 501/96; 118/726; 75/244
[58] Field of Search ............... 428/600, 596; 501/96; 118/726

[56] References Cited

U.S. PATENT DOCUMENTS

| | | | |
|---|---|---|---|
| 3,063,865 | 11/1962 | Baer et al. | 118/726 |
| 3,539,769 | 11/1970 | Barker | 118/726 |
| 3,906,892 | 9/1975 | Van Cakemberghe | 118/726 |
| 3,928,244 | 12/1975 | Passmore | 501/96 |
| 4,087,589 | 5/1978 | Bessen | 428/596 |
| 4,373,952 | 2/1983 | Parcut | 75/244 |

Primary Examiner—Veronica O'Keefe
Attorney, Agent, or Firm—James Theodosopoulos

[57] ABSTRACT

As intermetallic composite, bar evaporation source constructed from a mixture of borides and nitrides for use in the evaporation of metals, e.g., aluminum, is arc sprayed with a layer of the metal to be subsequently evaporated therefrom before use. The coated layer of the metal to be evaporated increases the wettability of the bar source cavity and creates greater electrical stability when compared with similar but uncoated bars.

3 Claims, 3 Drawing Figures

BAR EVAPORATION SOURCE HAVING IMPROVED WETTABILITY

TECHNICAL FIELD

This invention relates to intermetallic compositions and more particularly to self resistance heated bar sources employed for the evaporation of materials and still more particularly to such sources having improved wettability.

BACKGROUND ART

The use of vacuum hot pressed intermetallic composites as self resistance heated evaporation sources is well established. These composites are employed in the evaporation of aluminum and a wide range of other metals and alloys. One class of these composites comprises binary intermetallics composed of titanium diboride ($TiB_2$) and boron nitride (BN). Another class comprises ternary intermetallics including the above-named materials with the addition of aluminum nitride (AlN). Other intermetallics include small quantities of tungsten or calcium compounds. These composites are available in a wide range of resistivities of from about 50 to 2000$\mu$ $\Omega$-cm (micro-ohm centimeter) and are usually provided with a cavity to hold the evaporant.

Prior art composites employed in evaporation processes have had a problem of maintaining a consistency of cavity wetting over the entire cycle of the composites life. A particularly critical area in this life cylce is the very beginning of the evaporation cycle where the evaporant is initially introduced to the high temperature source.

DISCLOSURE OF THE INVENTION

It is, therefore, an object of the invention to obviate the disadvantages of the prior art.

It is another object of the invention to provide an improved intermetallic composite.

These objects are accomplished, in one aspect of the invention, by the provision of an intermetallic composite, bar evaporation source for use in the evaporation of a given metal. The source comprises a mixture of borides and nitrides and contains an evaporant cavity therein. A spray coating of the given metal is applied to the cavity surface.

Pre-coating the cavity, by spraying, with the metal to subsequently be evaporated therefrom greatly improves the initial wetting capabilities of the source.

Surprisingly, the coated bar sources also show greater electrical stability with a consequent ease of running. Additionally, the improved wetting of the coated bars lessens bar deterioration, when compared with similar but un-precoated bars.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
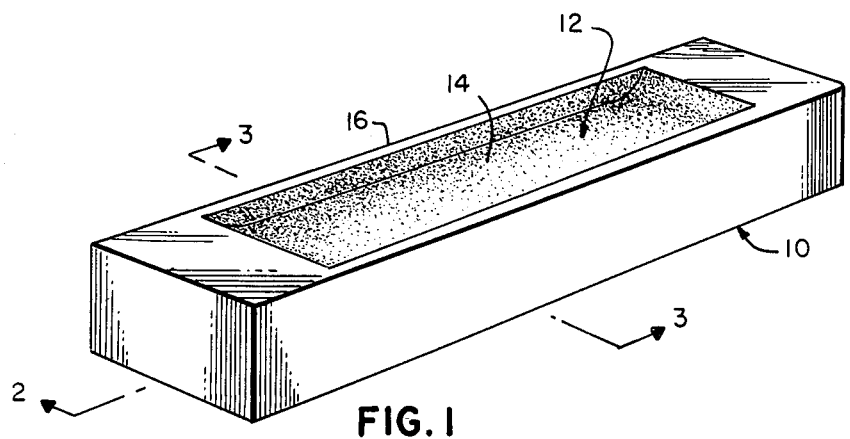
FIG. 1 is a perspective view of an embodiment of the invention.
Figure 3:
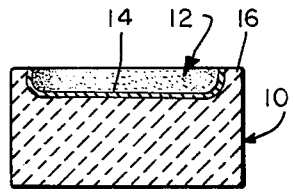
FIG. 3 is a sectional view taken along the line 3—3 of FIG. 1.
Figure 2:
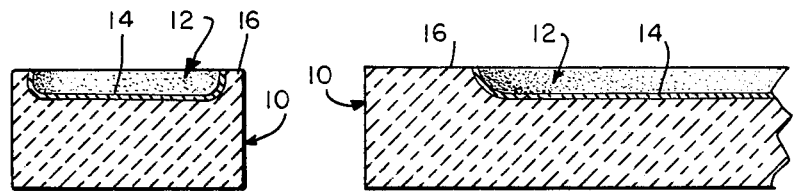
FIG. 2 is a sectional view taken along the line 2—2 of FIG. 1.

Referring now to the drawings with greater particularity, there is shown in FIG. 1 an intermetallic composite, bar evaporation source 10.

In a particular embodiment, an intermetallic composite, bar evaporation source can be prepared comprising the following ingredients, in weight percent: about 50.2% titanium diboride; about 30.0% boron nitride; about 11.9% aluminum nitride and about 7.9% tungsten, in accordance with the teachings of U.S. patent application Ser. No. 313,002, filed Oct. 19, 1981 now U.S. Pat. No. 4,373,952 and assigned to the assignee of the present invention.

These materials can be blended in a ball mill to provide a substantially homogeneous mixture. The mixture is then placed in a hot graphite mold and hot pressed at about 1950° C. at a pressure of about 3000 psi.

After forming, a suitable cavity 12 having cavity dams or walls 16 is provided within a surface of the composite and at least the cavity surface is spray coated with the metal 14 which is subsequently to be evaporated therefrom. For example, when the bar source is to be employed for aluminum evaporation, a layer of aluminum is applied to the cavity, preferably by arc spraying, although other means, such as plasma spraying, for example, can be used.

When tested with an arc sprayed aluminum coating, bars made in accordance with this invention showed improved wetting and a lessening of bar deterioration during two hours running at a specific aluminum wire feedrate of 4.4 grams per minute per square inch of cavity area.

While there have been shown and described what are at present considered to be the preferred embodiments of the invention, it will be aparent to those skilled in the art that various changes and modifications can be made herein without departing from the scope of the invention as defined by the appended claims.

I claim:

1. An intermetallic composite, bar evaporation source for use in the evaporation of a given metal, said source being comprised of a mixture of borides and nitrides and having an evaporant cavity therein, the improvement comprising: said cavity including a surface and a spray coating of said given metal in intimate contact with said surface.

2. The bar evaporation source of claim 1 wherein said spray coating is arc-sprayed upon said surface.

3. The bar evaporation source of claim 2 wherein said given metal is aluminum.

* * * * *